United States Patent
Duwel et al.

(10) Patent No.: US 7,312,674 B2
(45) Date of Patent: Dec. 25, 2007

(54) RESONATOR SYSTEM WITH A PLURALITY OF INDIVIDUAL MECHANICALLY COUPLED RESONATORS AND METHOD OF MAKING SAME

(75) Inventors: Amy Duwel, Cambridge, MA (US); Luke Hohreiter, West Palm Beach, FL (US); Joung-Mo Kang, Belmont, MA (US); Douglas W. White, Lexington, MA (US); David J. Carter, Maynard, MA (US); Mathew Varghese, Arlington, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 0 days.

(21) Appl. No.: 10/946,541

(22) Filed: Sep. 21, 2004

(65) Prior Publication Data

US 2005/0140467 A1 Jun. 30, 2005

Related U.S. Application Data

(63) Continuation-in-part of application No. 10/631,695, filed on Jul. 31, 2003, now Pat. No. 7,005,946.

(60) Provisional application No. 60/401,580, filed on Aug. 6, 2002.

(51) Int. Cl.
*H03H 9/54* (2006.01)
(52) U.S. Cl. ............... 333/186; 333/189; 333/197; 310/334; 310/348; 310/365
(58) Field of Classification Search ........ 333/186–192, 333/197, 200; 310/321–323, 328, 353
See application file for complete search history.

(56) References Cited

U.S. PATENT DOCUMENTS

| | | | | |
|---|---|---|---|---|
| 3,185,943 A | | 5/1965 | Honda et al. | 333/189 |
| 3,634,787 A | * | 1/1972 | Newell | 333/186 |
| 4,137,511 A | * | 1/1979 | Jones | 333/186 |
| 4,642,508 A | * | 2/1987 | Suzuki et al. | 310/321 |
| 5,717,365 A | * | 2/1998 | Kaida et al. | 333/187 |
| 5,751,200 A | * | 5/1998 | Yamashita et al. | 333/197 |
| 6,060,818 A | | 5/2000 | Ruby et al. | 310/363 |
| 6,306,313 B1 | | 10/2001 | Fetter et al. | 216/67 |
| 6,339,365 B1 | | 1/2002 | Kawase et al. | 333/193 |
| 6,486,751 B1 | | 11/2002 | Barber et al. | 333/187 |
| 6,534,900 B2 | | 3/2003 | Aigner et al. | 310/326 |
| 6,608,427 B2 | * | 8/2003 | Akiyama et al. | 310/333 |
| 6,762,471 B2 | | 7/2004 | Kim | 257/414 |

(Continued)

OTHER PUBLICATIONS

Demirci et al., *Mechanically Corner-Coupled Square Microresonator Array for Reduced Series Motional Resistance*, The 12th International Conference on Solid State Sensors, Actuators, and Microsystems, Jun. 8-12, 2003, pp. 955-958, vol. 2.

(Continued)

*Primary Examiner*—Barbara Summons
(74) *Attorney, Agent, or Firm*—Iandiorio & Teska

(57) ABSTRACT

A resonator system wherein a plurality of resonators each including piezoelectric material are suspended relative to a substrate. An edge of each resonator is mechanically coupled to an edge of another resonator and the plurality of resonators expand and contract reaching resonance in response to an applied electric field.

14 Claims, 11 Drawing Sheets

U.S. PATENT DOCUMENTS 7,005,946 B2 * 2/2006 Duwel et al. .............. 333/187
2006/0044078 A1 * 3/2006 Ayazi et al. .............. 333/186

OTHER PUBLICATIONS

Plessky et al., *Balanced Lattice Filter With Acoustically Interacting Resonators*, 2002 IEEE Ultrasonics Symposium, pp. 143-145, vol. 1, Oct. 2002.

V.B. Chvets, *Design of Side Band Transversely Coupled Resonator Filters on Quartz*, 2002 IEEE Ultrasonics Symposium, pp. 173-177, vol. 1, Oct. 2002.

Lakin et al., *High Performance Stacked Crystal Filters for GPS and Wide Bandwidth Applications*, 2001 IEEE Ultrasonics Symposium, pp. 833-838, vol. 1, Oct. 2001.

Diamantis et al., *A Programmable MEMS Bandpass Filter*, Proceedings of the 43rd IEEE Midwest Symposium on Circuits and Systems, Lansing MI, Aug. 8-11, 2000 pp. 522-525, vol. 1.

Clark et al., "Parallel-Resonator HF Micromechanical Bandpass Filters," Transducers, 1997, pp. 1161-1164, vol. 2, Jun. 1997.

Cleland et al., "Fabrication of High Frequency Nanometer Scale Mechanical Resonators From Bulk Si Crystals," Appl. Phys. Lett., vol. 69, No. 18, Oct. 28, 1996, pp. 2653-2655.

Craninckx et al., "A 1.8-GHz Low-Phase-Noise CMOS VCO Using Optimized Hollow Spiral Inductors," IEEE Journal of Solid-State Circuits, vol. 32, No. 5, May 1997, pp. 736-744.

Driscoll et al., "Extremely Low Phase Noise UHF Oscillators Utilizing High-Overtone, Bulk-Acoustic Resonators," IEEE Transactions on Ultrasonics, Ferroelectrics, and Frequency Control, vol. 39, No. 6, Nov. 1992, pp. 774-779.

Dubois et al., "BAW Resonators Based on Aluminum Nitride Thin Films," IEEE Ultrasonics Symposium, 1999, pp. 907-910, vol. 2, Oct. 1999.

Grudkowski et al., "Fundamental-Mode VHF/UHF Minature Acoustic Resonators and Filters on Silicon," Appl. Phys, Lett., vol. 37, No. 11, Dec. 1, 1980, pp. 993.995.

Kline et al., "Overmoded High Q Resonators for Microwave Oscillators," IEEE International Frequency Control Symposium, 1993, pp. 718-721.

Krishnaswamy et al., "Film Bulk Acoustic Wave Resonator Technology," Ultrasonics Symposium, 1990, pp. 529-536, vol. 1, Dec. 1990.

Lakin et al., "High-Q Microwave Acoustic Resonators and Filters," IEEE Transactions on Microwave Theory and Techniques, vol. 41, No. 12, Dec. 1993, pp. 2139-2146.

Lakin, "Thin Film Resonators and Filters," Presented at the 1999 IEEE International Ultrasonics Symposium, Oct. 17-21, 1999, paper M-1, pp. 1-12.

Larson III et al., "A BAW Antenna Duplexer for the 1900 MHz PCS Band," IEEE Ultrasonics Symposium, 1999, pp. 887-890, vol. 2, Oct. 1999.

Lutsky et al., "A Scaled Cavity TFR Process for RF Bandpass Filters," IEDM, 1996, pp. 4.4.1-4.4.4, Dec. 1996.

Stokes et al., "X-Band Thin Film Acoustic Filters on GaAs," IEEE Transactions on Microwave Theory and Techniques, vol. 41, No. 6/7, Jun./Jul. 1993, pp. 1075-1080.

Tsubouchi et al., "Zero-Temperature-Coefficient SAW Devices on AlN Epitaxial Films," IEEE Transactions on Sonics and Ultrasonics, vol. SU-32, No. 5, Sep. 1985, pp. 634-644.

Wang et al., "Low-Temperature Coefficient Bulk Acoustic Wave Composite Resonators," Appl. Phys. Lett., vol. 40, No. 4, Feb. 15, 1982, pp. 308-310.

Wang et al., "VHG Free-Free Beam High-Q Micromechanical Resonators," Journal of Microelectromechanical Systems, vol. 9, No. 3, Sep. 2000, pp. 347-360.

Wang et al., "VHF Free-Free Beam High-0 Micromechanical Resonators," Technical Digest, 12th International IEEE Micro Electro Mechanical Systems Conference, Orlando, Florida, Jan. 17-21, 1999, pp. 453-458.

Wang et al., "High-Order Medium Frequency Micromechanical Electronic Filters," Journal of Microelectromechanical Systems, vol. 8, No. 4, Dec. 1999, pp. 534-557.

Yao, "RF MEMS from a device perspective," J. Micromech. Microeng., vol. 10, 2000, pp. R9-R38, No. 4, Dec. 2000.

Ziaie et al., "A generic micromachined silicon platform for high-performance RF passive components," J. Micromech. Microeng., vol. 10, 2000, pp. 365-371, No. 3, Sep. 2000.

Gualtieri, J.G.; Ballato, A., *Advances in high-Q piezoelectric resonator materials and devices*, 5th Piezoelectric Devices Conference & Exhibition, Kansas City, Missouri, Proceedings, vol. 1 (1993), pp. 1-12.

* cited by examiner

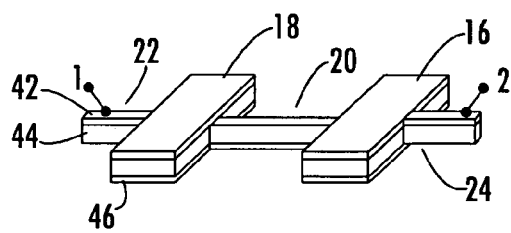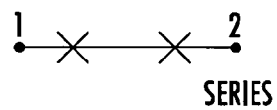
FIG. 4A SERIES
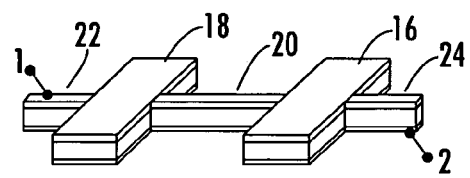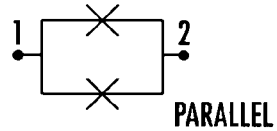
FIG. 4B PARALLEL
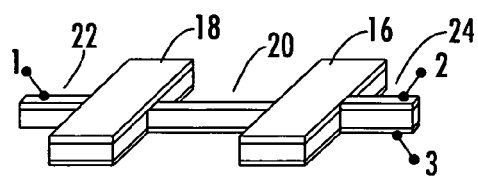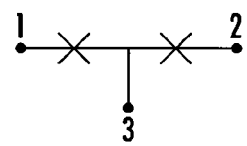
FIG. 4C MULTI-TERMINAL
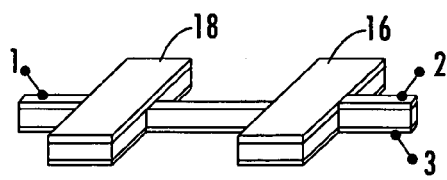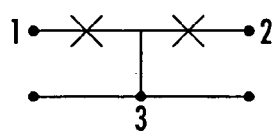
FIG. 5A COMMON ELECTRODE FILTER
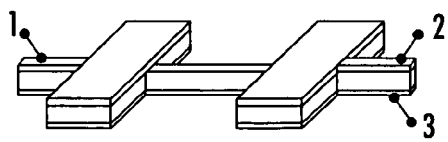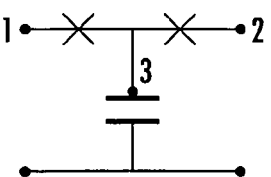
FIG. 5B LADDER FILTER

RESONATOR SYSTEM WITH A PLURALITY OF INDIVIDUAL MECHANICALLY COUPLED RESONATORS AND METHOD OF MAKING SAME

RELATED APPLICATIONS

This application is a continuation-in-part application of U.S. patent application Ser. No. 10/631,695 filed Jul. 31, 2003, now U.S. Pat. No. 7,005,946, which claims priority to Provisional Application No. 60/401,580 filed Aug. 6, 2002.

GOVERNMENT RIGHTS

This invention was made with Government support under Contract No. DAAH01-01-C-R204 awarded by the United States Army. The Government has certain rights in the invention.

FIELD OF THE INVENTION

This invention relates to a MEMS piezoelectric resonator with multiple edge coupled resonators.

BACKGROUND OF THE INVENTION

As delineated in the parent application, resonators are traditionally employed as components, in among other things, filters and oscillators. Resonators have gained greater importance lately with the growth of mobile communications technology and the increasing clock speed of computers. Mobile devices require small precision filters, and computer clocks require oscillators capable of error-free high frequency oscillation. Typical resonator applications require resonators to demonstrate Q values higher than one thousand at an impedance load of approximately 50 Ω, be compatible with common voltage ranges of typical integrated circuits, and to resonate at frequencies near or above 1 GHz.

Conventional resonators include, for example, surface acoustic wave (SAW) resonators, fundamental mode thin film resonators (TFRs), flexural mode MEMS beam resonators, guided electromagnetic wave structures, lumped element inductors and capacitors, thin film bulk acoustic resonators (TFBARs), overmoded bulk crystals, and solidly mounted resonators (SMRs). These filters suffer from a variety of shortcomings. For example, many are too large for placement onto an integrated circuit, operate in an unsatisfactorily small frequency range, require too high a voltage for operation, and/or cannot achieve a sufficiently high Quality (Q) level with a 50 Ω load. Q is a measure of the energy efficiency of a filter and also is a measure of the sharpness of the filter's frequency response, i.e., a high Q filter passes a narrower band of frequencies than a lower Q filter.

Many traditional resonators are too large to incorporate one or more resonators onto an integrated circuit. For example, thin-film resonators (TFRs) commonly have a footprint on the order of hundreds of microns. Surface acoustic wave (SAW) resonators are typically even larger, in some cases requiring substrates as large several centimeters or inches to exhibit desirable performance characteristics.

Several traditional resonators operate in an undesirably limited frequency range. MEMS flexural mode beam resonators typically do not operate satisfactorily in the Ultra-High Frequency range. Similarly, TFBARs and SMRs are difficult to make with center frequencies much below 1 GHz since film stress becomes an issue as the film thickness is increased. Furthermore, with most film based resonators, multiple resonators with differing frequencies cannot be placed on a single integrated circuit because the film thickness is typically uniform across a substrate.

Many MEMS flexural mode beam resonators also suffer from requiring activation voltages that make the resonators difficult to integrate in standard integrated circuits. MEMS flexural mode beam resonators are commonly actuated capacitively, in some cases requiring as much a 50V to achieve resonance.

Many conventional resonators do not exhibit high enough Q levels with a 50 Ω load. Typical lumped element inductors, SMRs, and many TFBARs fail to meet the desired Q level of 1000 in response to operating with a 50 Ω load. MEMS flexural mode beam resonators can operate with higher Q levels, but usually require operation in a vacuum to do so.

The parent application Ser. No. 10/631,695 published Feb. 12, 2004, is hereby incorporated herein by this reference.

Capacitively actuated MEMS devices have also been mechanically coupled to achieve lower impedance and/or to introduce multiple closely spaced modes for a filter passband. See M. Demirci et al., *Mechanically Corner-Coupled Square Microresonator Array for Reduced Series Motional Resistance*, The 12$^{th}$ International Conference on Solid State Sensors, Actuators, and Microsystems, Jun. 8-12, 2003, pp. 955-958, also incorporated herein by this reference. Inherent in the capacitive actuation is high impedance (>10$^4$ Ω) unless nano-scale fabrication is achieved. In addition, the device response is linear only over a limited range and high bias voltages may be necessary for operation. Other MEMS resonators can also have multi-tap designs. Those skilled in the art have explored multi-tap designs extensively. For example, surface acoustic wave (SAW) devices have the option of using multiple electrical taps on a single mechanical device as discussed in V. Plessky et al., *Balanced Lattice Filter With Acoustically Interacting Resonators*, 2002 IEEE Ultrasonics Symposium, pp. 143-145 and V. B. Chvets, *Design of Side Band Transversely Coupled Resonator Filters on Quartz*, 2002 IEEE Ultrasonics Symposium, pp. 173-177. Both of these papers are incorporated herein by this reference. Thus, there is an opportunity to make a two-port device or a multi-terminal device that has certain advantages in circuit designs. The disadvantage of using SAW devices in general, however, is their large size and limited quality factor (Q). RF Monolithics, Inc., for example, offers a 916.5 MHz SAW filter with a maximum insertion loss of 2.5 dB. The unloaded Q values are given as 23,509 and the 50-Ω loaded Q value is 4,000 (part No. R02144A). However, the footprint of single SAW resonators is on the order of millimeters and they are not readily integrated with other process technologies.

Thin film resonators (TFR's and FBAR's) and solidly mounted resonators (SMR's) are another category of piezoelectric resonators. In these devices, a piezoelectric material is sandwiched by two electrodes in a capacitor-like geometry. The targeted resonance is a compressional wave in the thickness direction rather than in the length or width direction. These devices can also be suspended, so that the acoustic mode does not couple energy into the substrate. The primary differences between TFR's, FBAR's, and SMR's are related to the mechanical mounting and boundary conditions of the device. Mechanical coupling between two or more such resonators can be achieved by stacking them on top of each other as discussed in K. M. Lakin et al., *High*

Performance Stacked Crystal Filters for GPS and Wide Bandwidth Applications, 2001 IEEE Ultrasonics Symposium, pp. 833-838, incorporated herein by this reference. For example, the layers would be: metal, piezoelectric, metal, piezoelectric, and metal. When the shared metal electrode is grounded and the other two electrodes are used as input and output electrodes, this is called the stacked crystal filter (SCF). These devices may be difficult to manufacture, since the stress in the stack must be well-controlled and access to inner metal electrode layers is necessary. Other drawbacks of these devices include the relatively large footprint and the difficulty of fabricating devices with different resonant frequencies, for example film thicknesses on a single chip.

References is also made to S. Diamantis et al., *A Programmable MEMS Bandpass Filter*, Proceedings of the 43$^{rd}$ IEEE Midwest Symposium on Circuits and Systems, Lansing Mich., Aug. 8-11, 2000 pp. 522-525, incorporated herein by this reference. This paper refers to a flexural mode resonator which is capacitively activated.

SUMMARY OF THE INVENTION

It is therefore an object of this invention to provide a new resonator system including two or more individual resonators mechanically coupled.

It is a further object of this invention to provide such a system which provides an increased bandwidth.

It is a further object of this invention to provide such a system which can be tuned by varying the geometry of the mechanical interconnection between the two or more individual resonators.

It is a further object of this invention to provide such a system which can be used as a filter.

It is a further object of this invention to provide such a system which allows for wider filter bandwidth.

It is a further object of this invention to provide such a system with many possible variations of electrode interconnections.

It is a further object of this invention to provide such a system which can be manufactured as a multi-terminal device.

It is a further object of this invention to provide such a system which avoids the need for sub-micron gaps and large actuation voltages.

It is a further object of this invention to provide such a system in which the choice of a longitudinal mode in a plane of the wafer allows the frequencies to be lithographically controlled.

It is a further object of this invention to provide such a system in which arrays of resonators with widely different center frequencies can be fabricated on a single chip.

It is a further object of this invention to provide such a system in which the Young's modulus variation with temperature can be compensated for by adding a thin film with a temperature response complementary to the rest of the resonator materials.

It is a further object of this invention to provide such a system which can be made very small.

It is a further object of this invention to provide such a system with improved impedance matching features.

It is a further object of this invention to provide such a system incorporating a piezoelectric material such as aluminum nitride thus allowing for integration with silicon CMOS, SiGe, and other RF ASIC technologies.

It is a further object of this invention to provide such a system in which all of the resonators can have the same mode frequencies.

It is a further object of this invention to provide such a system with additional modes which can be closely spaced and used for bandpass filter designs.

The subject invention results from the realization that by mechanically coupling an edge of one resonator to an edge of another resonator, the bandwidth of the resonator system is increased as the multiple resonators in the system expand and contract reaching resonance in response to an applied electric field.

The subject invention, however, in other embodiments, need not achieve all these objectives and the claims hereof should not be limited to structures or methods capable of achieving these objectives.

This invention features a resonator system comprising a substrate and a plurality of resonators each including piezoelectric material suspended relative to the substrate. An edge of each resonator is mechanically coupled to an edge of another resonator and the plurality of resonators expand and contract reaching resonance in response to an applied electric field.

In the preferred embodiment, there is a tether between each pair of resonators and the tether has a geometrical shape tailored to change the frequency response of the system. Typically, the resonators and the tether(s) all lie in the same plane. The fundamental frequency of all the resonators may be the same or approximately the same or, alternatively, the fundamental frequency of two or more resonators is different.

In one example, each resonator is rectangular in shape, one rectangular resonator is oriented with a long edge parallel to and facing a long edge of another rectangular resonator, and the tether extends between said long edges.

The electrode and electrical interconnection configuration can vary but in one example, one resonator includes an input electrode disposed on a first surface thereof and another said resonator includes an output electrode on a second surface thereof.

In the typical embodiment, the piezoelectric material is aluminum nitride. Flexural supports can be provided for suspending the resonators relative to the substrate. In one example, substrate includes a cavity and the flexural supports suspend the resonators relative to the cavity in the substrate.

One example of a resonator system in accordance with this invention includes a substrate and at least two piezoelectric members each coupled via a tether connecting spaced edges of the two members. A support is connected to each outer member for suspending the members relative to the substrate and electrode material extends along at lease one side of each support, opposite sides of both members, and at least one side of the tether.

In one method of fabricating a MEMS piezoelectric resonator system, in accordance with this invention, a stack of layers is formed on a substrate. The stack includes at least one piezoelectric material layer spaced from the substrate by a sacrificial layer. The stack is patterned to form a plurality of edge coupled resonators. At least a portion of the sacrificial layer is removed to suspend the resonators relative to the substrate. The patterning step may include the use of a mask and an etchant. The step of removing the sacrificial layer typically includes etching. In most embodiments, the stack also includes electrode layers on at least opposite sides of the piezoelectric material layer.

BRIEF DESCRIPTION OF THE DRAWINGS

Other objects, features and advantages will occur to those skilled in the art from the following description of a preferred embodiment and the accompanying drawings, in which:

FIGS. 4A-4C are schematic views showing possible electrode configurations in accordance with the subject invention;

FIGS. 5A-5B are schematic views showing additional electrode configurations possible in a resonator system in accordance with the subject invention;

DISCLOSURE OF THE PREFERRED EMBODIMENT

Figure 1:
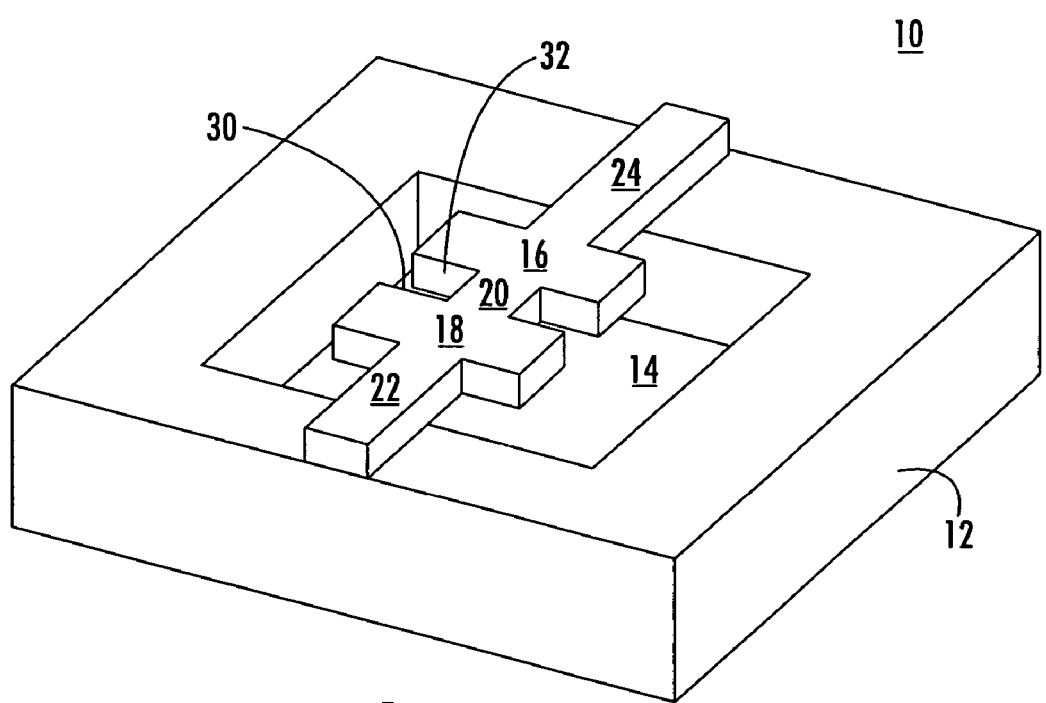
FIG. 1 is a highly conceptual perspective view of one embodiment of a resonator system in accordance with the subject invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

In one embodiment of the subject invention, dual resonator system 10, FIG. 1 includes silicon, silicon germanium, gallium arsenide, or glass substrate 12 with cavity 14 over which are suspended resonators 16 and 18 via supports 22 and 24. If there are more than two resonators, supports 22 and 24 are typically edge coupled to the outer resonators. Resonators 16 and 18 are mechanically edge coupled via tether 20. In the view of FIG. 1, no electrodes are shown. Typically, the resonator structure comprising support 12, resonator 18, tether 20, resonator 16, and support 24 are made of a single piece of piezoelectric material such as Aluminum Nitride. Resonators 16 and 18 expand and contract in the direction of their length, width, and thickness in response to an applied electric field. The geometrical shape of resonators 18 and 20 and of tether 20 can be tailored to change the frequency response of system 10. In one embodiment, for example, each resonator 16 and 18 was 6 µm long, 3 µm wide, and 0.5 µm thick. Tether 20 was 7 µm long, 1.5 µm wide, and 0.5 µm thick. In another embodiment, however, tether 20 was 14 µm long and 1.5 µm wide. Many different geometries for resonators 18 and 20 and tether 20 are possible providing for distinct resonator sections and the ability to independently locate the electrodes.

Typically, rectangular shaped resonators 16 and 18 and tether 20 all lie in the same plane as shown in FIG. 1 and typically the fundamental frequencies of resonators 16 and 18 are the same or approximately the same given manufacturing limitations and tolerances. But, these are not necessary limitations of the subject invention. In other embodiments, the fundamental frequencies of resonators 16 and 18 may be different, there may be additional resonators (i.e., more than two) and it may be preferred, but it is not necessary, as shown in FIG. 1, that resonators 16 and 18 are rectangular in shape and that long edge 30 of resonator 18 is parallel to and faces long edge 32 of resonator 16 with tether 20 extending between edges 30 and 32. Each resonator may include a piezoelectric member made wholly out of or including a piezoelectric material.

Figure 2:
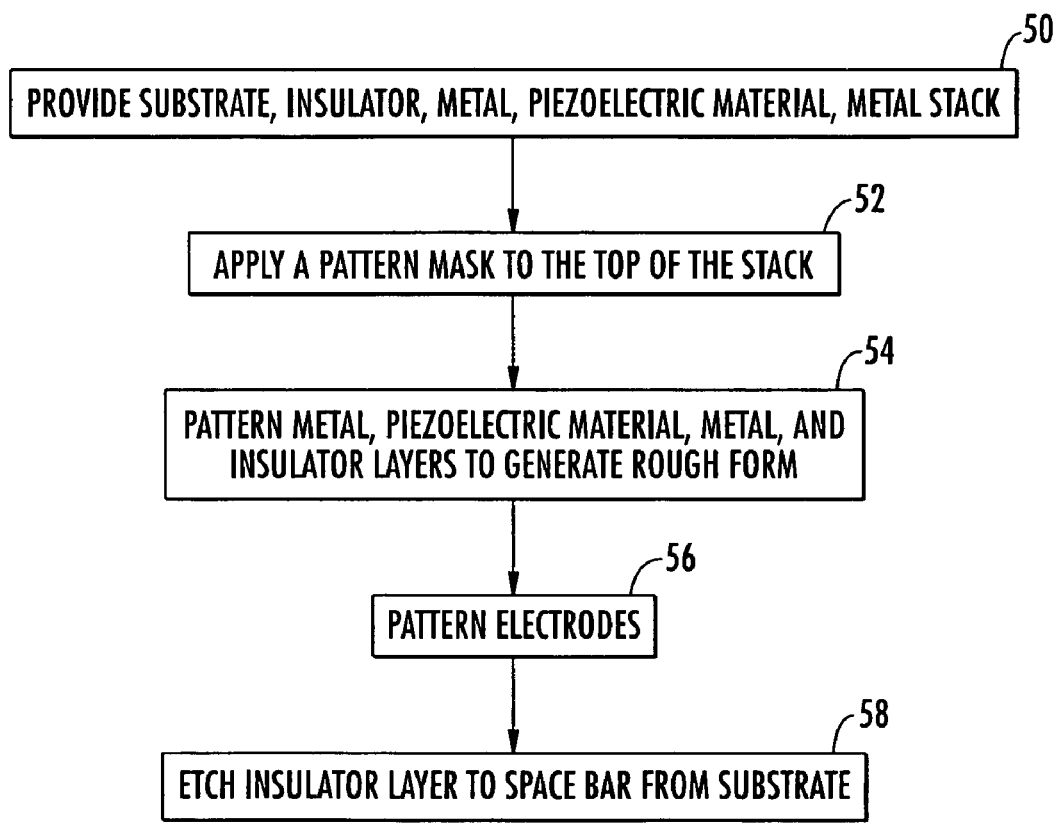
FIG. 2 is a flow chart depicting the primary steps associated with manufacturing a resonator system in accordance with the subject invention.
Figure 3A:
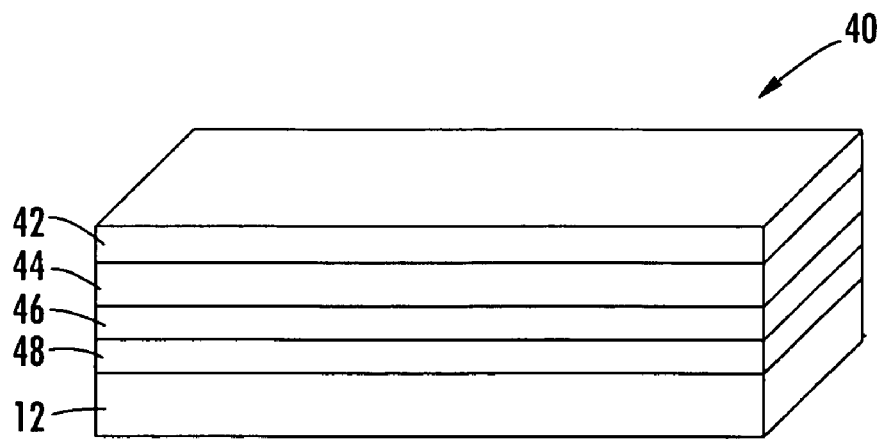
FIGS. 3A-3C are conceptual three-dimensional views showing several stages of the fabrication process as set forth in FIG. 2.

In another embodiment, a stack 40, FIG. 3A including electrode layer 42, piezoelectric layer 44, electrode layer 46, and sacrificial layer 48 is formed on substrate 12, step 50, FIG. 2. Substrate 12 may be silicon, $SiO_2$, SiGe, GaAs, or glass. The metal forming electrode layers 42 and 46 may be molybdenum, nickel, titanium, aluminum, and combination of these and other metals. Sacrificial layer 48 may be an insulator such as an oxide.

Figure 3B:
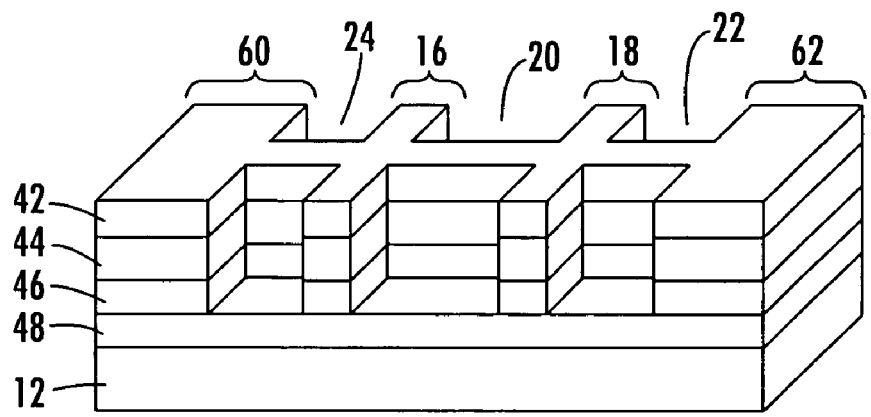

Next, stack 40, FIG. 3B is patterned to form resonators 16 and 18 edge coupled by tether 20, steps 52 and 54, FIG. 2. Typically, a pattern mask is applied to electrode layer 42, FIG. 3A, step 52, FIG. 2 and the metal electrode layers 42 and 46 and the piezoelectric material layer 44 are patterned using a series of etches to create the rough form of the resonator system shown in FIG. 3B. The lateral dimensions of the pattern mask may be used to set the resonant frequency of the resonator. Illustratively, a wet chemical etch is used to shape electrode layer 42, a chlorine-based dry reactive ion etch (RIE) is used to shape piezoelectric layer 44, and a fluorine-based RIE is used to shape electrode layer 46 and insulating layer 48. In the rough form, electrodes 16 and 18, tether 20, flexural supports 22 and 24, and the unprocessed electrodes 42 and 46 are recognizable. The two structures on either end of flexural supports 22 and 24 are mounting pads 60 and 62. In other fabrication processes involving different electrode metals, the rough form may be shaped using a single chlorine-based RIE etch. In either fabrication process, a pattern mask (preferably a single pattern mask) may be used to generate the rough form of the dual resonator system shown.

Figure 3C:
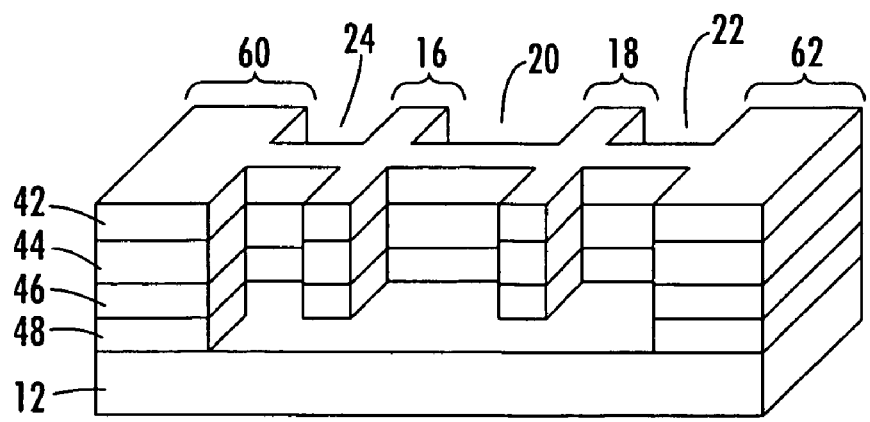
Figure 6A:
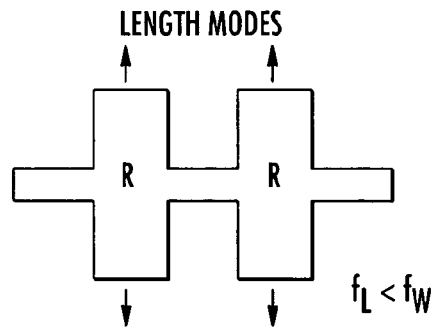
FIGS. 6A-6F are schematic top views showing different modes of operation of several resonator systems in accordance with the subject inventions.
Figure 6B:
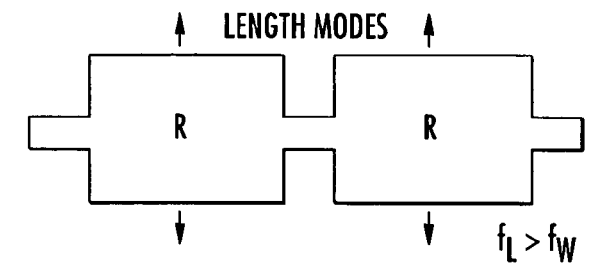
Figure 6C:
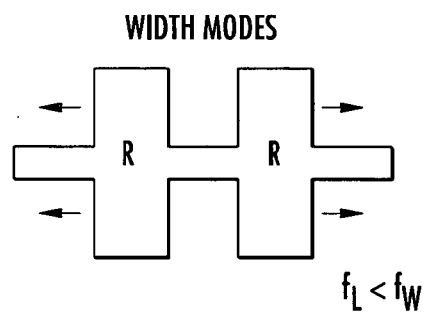
Figure 6D:
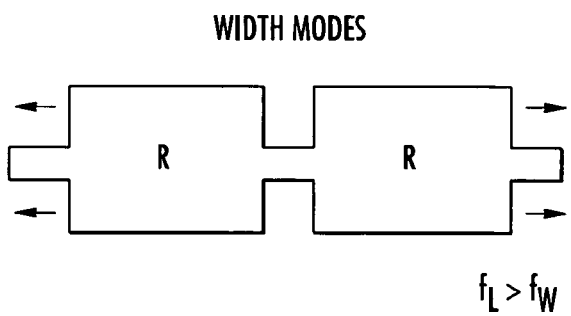
Figure 6E:
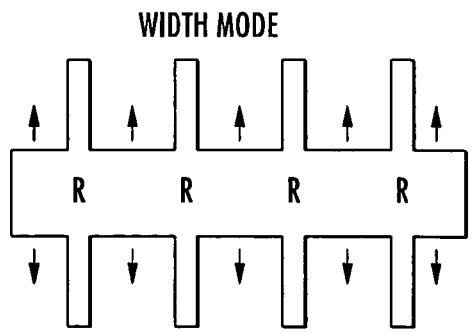
Figure 6F:
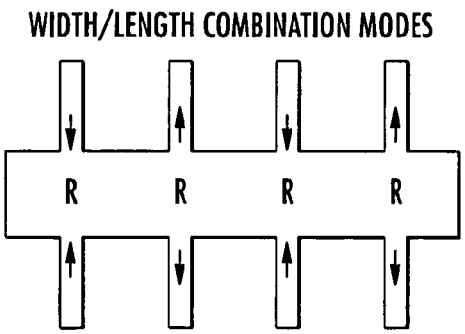

In step 56, FIG. 2, the electrodes are patterned. This step is not shown in FIG. 3 because the electrode configurations will vary depending on the specific design. The parent application, however, provides an example of forming current stops in electrode layers 42 and 46, FIG. 3B. In step 58, FIG. 2, insulating layer 48, FIG. 3C is etched away such that the insulating material beneath resonators 16 and 18, tether 20, and flexural supports 22 and 24 is removed and insulating material remains beneath mounting pads 60 and 62 to form insulating pads. In one particular embodiment, the mounting pads are wider than resonators 16 and 18 and flexural supports 22 and 24. Therefore, by applying a wet etch that etches away the insulating material from the outside in, the etching time can be readily limited to meet this constraint. After the insulating material is etched away, resonators 16 and 18 and tether 20 are free to oscillate being suspended away from substrate layer 12 by the insulating pads that remain between the bases of the mounting pads 60 and 62 and substrate 12. In other embodiments, an insulator or other sacrificial layer may not be required.

The result is a piezoelectric, typically longitudinal mode, high-frequency mechanical resonator system which can be used in UHF resonator and oscillator circuits. The piezoelectric resonators are actuated by electric fields applied across their thickness. Electrodes cover the top and bottom surfaces of the resonators so that electrically, each resonator is constructed as a capacitor. However, the resonators are mechanically constructed so that they are free to vibrate. Longitudinal vibration is the preferred but not the only mode of operation. The frequency of this mode is determined by the dimensions of each resonator 16 and 18 and connecting tether 20. Length, width, or thickness modes can be utilized, and their respective frequencies relative to each other are set by the designer. When an electrical signal is applied across the electrodes with a frequency matching the fundamental longitudinal vibration, the resonators are excited into resonance. As a result, a charge is generated by the piezoelectric material. The current voltage characteristic of this one-port element is a series RLC circuit, like that of a typical crystal resonator. Unlike the existing quartz crystal resonator, however, the system of the subject invention is small, integrated, and can operate at frequencies in the GHz range.

The electrical connections between the coupled resonators can take on various configurations—they can be connected in series, in parallel, or configured as a three terminal device. There can be multiple resonators (with more electrical terminals) if desired. The entire multi resonator system is a new mechanical device whose mechanical modes can be predictably excited by the electrode configurations and interconnections. The device is linear, and multiple modes can be excited simultaneously. One function of the additional resonators is to include more modes in the electrical transfer function (closely spaced modes that pass signal equally can be useful in filter designs). Another function is to provide a multi-terminal device for use in filter designs. Still another function is to provide another method for designing the electrical impedance of the mechanical resonator through parallel and series interconnects on the multiple resonator stages. The primary application envisioned is in UHF circuit designs, such as bandpass filters.

FIG. 4 illustrates several possible electrical configurations of a two-resonator system where the electrical taps are labeled 1, 2, and 3 and the various electrode patterns for electrode layers 42 and 46 are described. In the examples shown, electrode material extends along at least one side of each support 22 and 24, on both sides of the piezoelectric layers forming resonators 16 and 18, and along at least one side of tether 20. In FIG. 4B, in contrast to FIG. 4A, the input 1 is on the top surface of support 22 (and resonator 18) and the output 2 is on the bottom surface of support 24 (and resonator 16). In FIG. 4A, the top electrode layer is removed from at least a portion of the top of tether 20 and the bottom electrode layer is removed at least a portion of the bottom of supports 22 and 24. In FIG. 4C, the top electrode layer is removed from at least a portion of the top of tether 20 and the bottom of support 22. In the multi-terminal case, the electrical tap labeled 3 can be accessed from either side. Alternatively, a tap can extend directly from tether 20 by making a T-connection. Simulations indicate that the mechanical effects of such a center connection can be minimized by proper design.

According to the subject invention, there will be an "in-phase" and an "anti-phase" mechanical mode. In the in-phase length mode, resonators 16 and 18 stretch simultaneously. In the anti-phase mode, one resonator is at its maximum compression while the other resonator is at its maximum extension.

When connected electrically in parallel as shown in FIG. 4B, only the in-phase mode generates a net charge, and in this mode the electrical impedance is half that of a single resonator design. If the two resonators are not perfectly identically, then the in-phase mode has an impedance slightly greater than half the single resonator design, and the anti-phase mode also shows some impedance resonance.

When connected as a multi-terminal device, two useful circuit implementations are shown in FIG. 5. The resonator can be used in a configuration similar to a stacked crystal filter (common electrode topology) or it can be constructed in a ladder filter design.

In the common electrode topology, the coupling from input to output is purely mechanical. Despite the electrical short between the two devices, an input voltage on resonator 18 will generate an output voltage on resonator 16. As can be inferred from the geometry, both in-phase and anti-phase modes will produce equal responses. If they are closely separated in frequency, then these modes form a bandpass characteristic and this construction can be useful as a filter.

In the ladder filter implementation, FIG. 5B, a "coupling capacitor" connects the terminal labeled 3 to ground. In the limit of an infinitely large capacitance, this structure would look like a stacked crystal filter. Careful design of this capacitance versus the mechanical coupling between resonators can result in the ability to choose the bandwidth of the resulting filter.

A typical resonator is intended to operate in a fundamental longitudinal mode. In the simplest implementations, the resonator should be designed to be rectangular, so that the length and the width modes are well separated in frequency. While the resonator can be operated on either fundamental length or fundamental width or thickness resonance, the length mode is expected to produce higher Q values, since the supports are positioned at the node of the length mode.

The variations on the coupled resonator or multi-tap resonator designs discussed thus far implement different combinations of: (1) length mode versus width mode operation, (2) length mode higher or lower than width mode in frequency, (3) coupling of multiple resonators along the tethers versus tapping of multiple electrodes off of a single resonator.

As shown in FIGS. 6A-6F, the fact that resonances in the two resonators (or multiple sections of a single resonator) can have various phase relationships to each other is ignored. For now, the emphasis is on the mechanical coupling between portions of the structure that have separate electrical pickoffs. The interconnects between these pickoffs (series, parallel, etc) will depend on the application and are also not included in the schematic. In all cases, the resonators are labeled R and the shaded areas indicate where the electrodes would be positioned.

In a study of the comparison of performance obtained using single, uncoupled resonators in ladder filter designs versus a multi-terminal device, the full mechanical-piezoelectric response of the resonator and multi-terminal resonator devices was simulated. The ANSYS piezoelectric module was used for an electrically forced sinusoidal steady-state analysis.

Figure 7A:
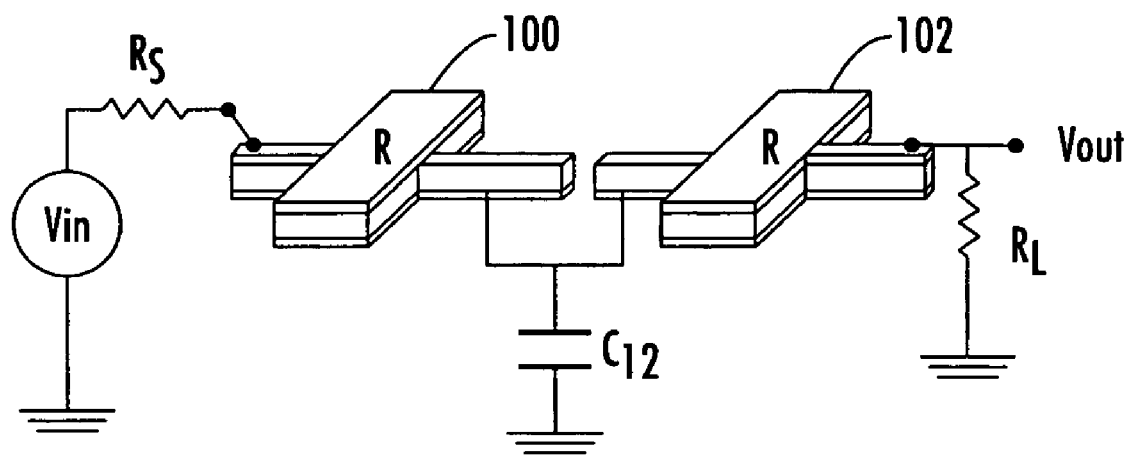
FIG. 7A is a schematic three-dimensional view showing a ladder filter circuit for two uncoupled resonators in accordance with the prior art.
Figure 7B:
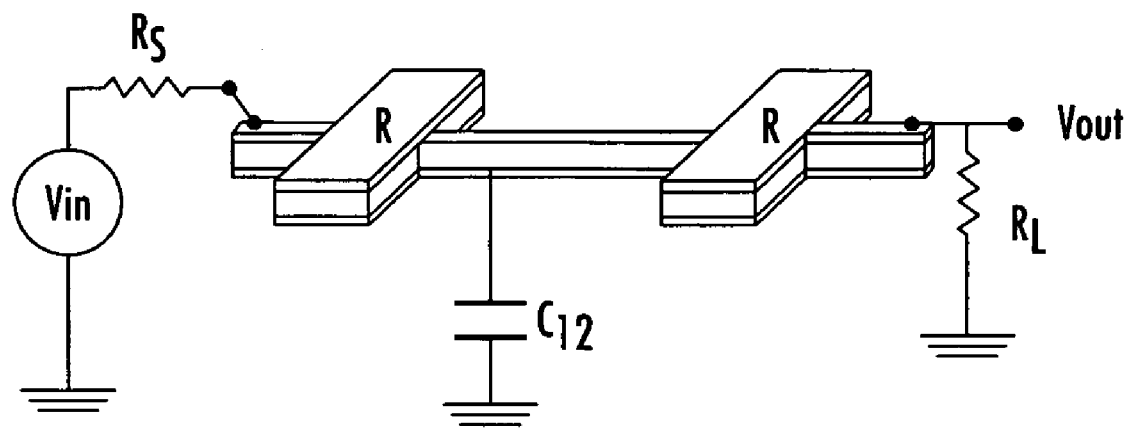
FIG. 7B is a schematic three-dimensional view showing a ladder filter in accordance with the subject invention where two resonators are mechanically coupled.
Figure 8:
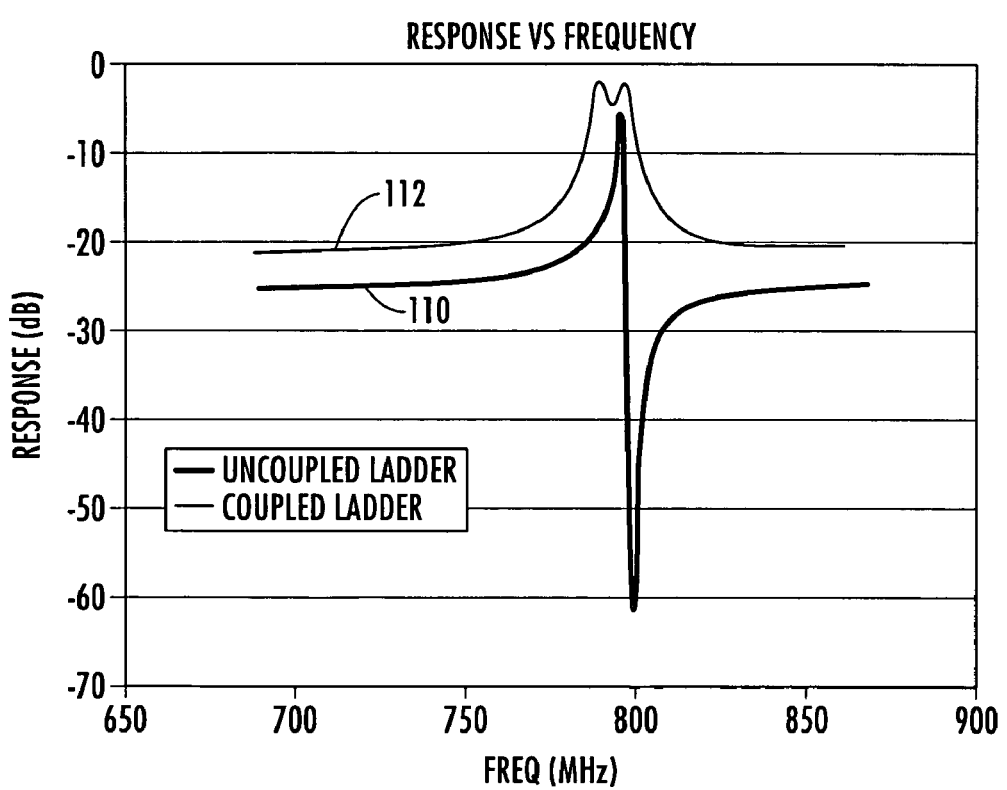
FIG. 8 is a graph of the response versus frequency for the prior art design shown in FIG. 7A compared to the exemplary design in accordance with the subject invention shown in FIG. 7B.

The devices simulated were 6×3×0.5 μm resonators. The supports were 7 microns long on a single resonator. For the double resonator, the outside supports were 7 microns long, and the inner (connecting) tether was 14 microns long. The mechanical boundary conditions applied to the outside supports mimic an infinite medium along the tether axis. Thus the tether is constrained to move only out of plane or perpendicular to its long axis. The electrical boundary condition forces an equi-potential surface on the bottom and top of the resonator. The electrode mass and stiffness are not included. Finally, the ANSYS module allows the top and bottom electrodes to be connected to driving sources or electrical ground through passive electrical elements, such as resistors and capacitors. This simulates the electromechanical response of the device, and to find its performance in a ladder filter circuit. The schematics in FIGS. 7A and 7B show the respective devices and electrical boundary conditions simulated. FIG. 8 shows the responses.

Resonators 100 and 102 of FIG. 7A are identical and electrically coupled, but not mechanically connected. This is the usual situation assumed by circuit designers. The ladder filter bandpass characteristic is shown at 110 in FIG. 8. The bandwidth is limited to less than about 3% for the ladder filter topology, by the piezoelectric coupling coefficients of the material. Typical designs are optimized for bandwidths less than 1% since otherwise the passband characteristics are difficult to optimize. The insertion loss, ripple, phase linearity, and rolloff can be optimized by using matched source and load impedances as well as careful choice of the coupling capacitor, $C_{12}$. For the example shown in FIG. 8, the Q chosen was 1000, which limits the design space and filter performance.

The response of the multi-terminal device of FIG. 7B in the ladder filter is markedly different as shown at 112 in FIG. 8. The two peaks shown in ("coupled ladder" simulation) are a result of in-phase and out-of-phase mechanical modes in the two-resonator system. The separation between these peaks can be tuned by tuning the mechanical coupling. In order to optimize a ladder filter design using this effect, a circuit model was developed. The circuit model uses inductive coupling between the two resonant elements to mimic the mechanical coupling effect. This model was not rigorously derived, but has intuitive basis in the fact that, if one resonator is driven mechanically, AC charges will be produced in both resonators. Another model may use capacitive coupling.

Figure 9:
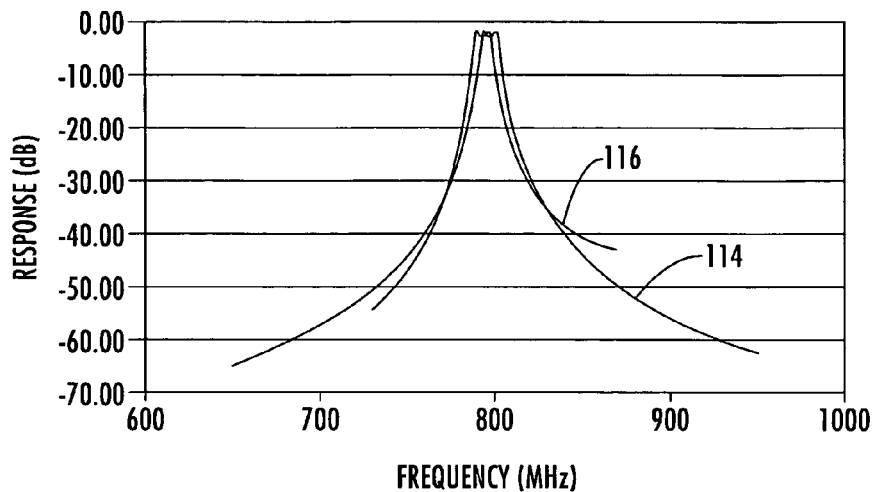
FIG. 9 is a graph showing the response versus frequency for another example of a multiple mechanically interconnected resonator design in accordance with the subject invention.
Figure 10:
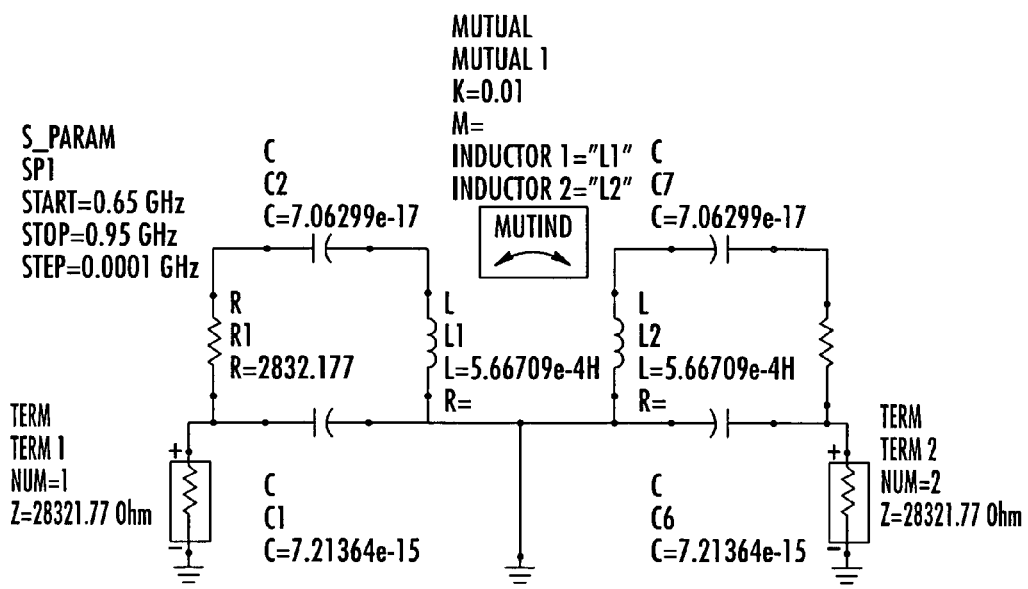
FIG. 10 is a circuit diagram for a circuit used to model the mechanically coupled resonators configured in the common electrode filter topology in accordance with the subject invention.

FIG. 9 shows the results of a comparison of the piezoelectric simulation (with mechanically coupled elements) and a circuit model for the stacked-crystal filter configuration (no coupling capacitor), as in FIG. 4A. The circuit model of FIG. 10 replicates the bandwidth when the mutual coupling is 1% of the self-inductance. The circuit model, as it stands, does not replicate the center frequency perfectly, but corrections to the circuit model can easily address this. The circuit model was simulated using Agilent Technologies, Inc.'s Advanced Design System microwave circuit simulation program. FIG. 10 shows the schematic. Ongoing work at providing accurate and well-justified circuit models will help to provide tools for optimized filter designs. As can be seen from these preliminary results, the mutual coupling introduces a new parameter in the filter design and allows for much wider bandwidth than the standard, un-coupled device can. In addition, rolloff and insertion loss improvements are possible.

FIG. 9 thus shows the results of a piezoelectric FEA simulation at 114 compared to a circuit model simulation at 116. The FEA simulation used coupled resonators that are 6×3×0.5 μm in dimension, with a coupling tether of 14 μm long (identical to the two-resonator design of FIG. 7B) and Q=1000. The mechanical system simulated is that of FIG. 7B, but with C12 replaced by a short (as a stacked crystal filter). The RLC parameters used in the circuit model are extracted from an ANSYS simulation of a single resonator of dimensions 6×3×0.5 μm and Q=1000. In the circuit model, inductive coupling is used to capture the mechanical effect. A value of 1% approximates the bandwidth well.

Figure 11:
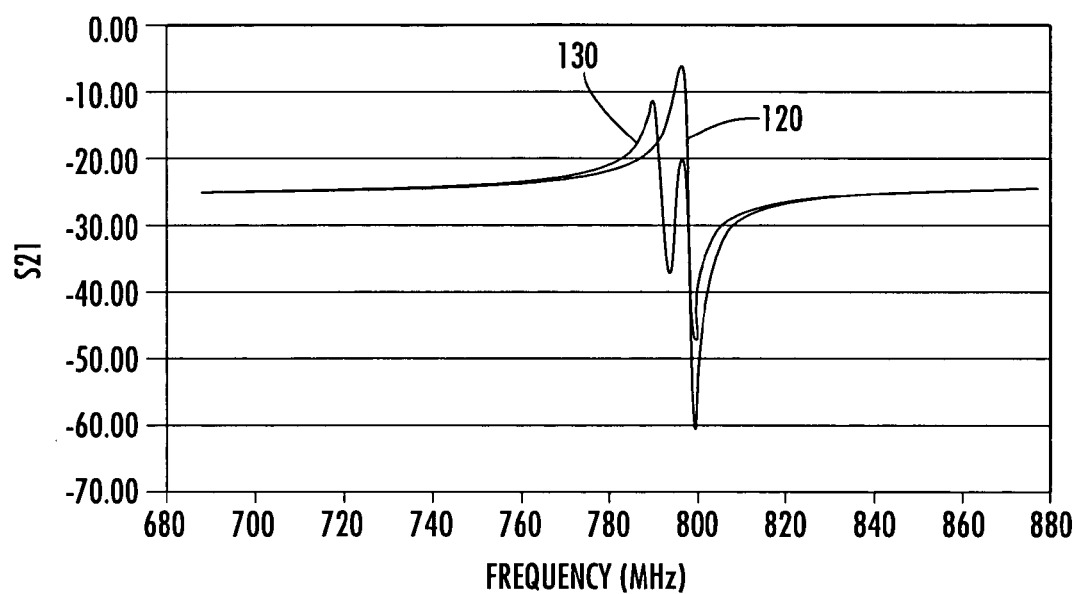
FIG. 11 is a graph showing the response versus frequency for a ladder filter prior art design of FIG. 7A when the mechanically uncoupled resonators thereof have different lengths compared to the situation where the resonators thereof have identical lengths.
Figure 12:
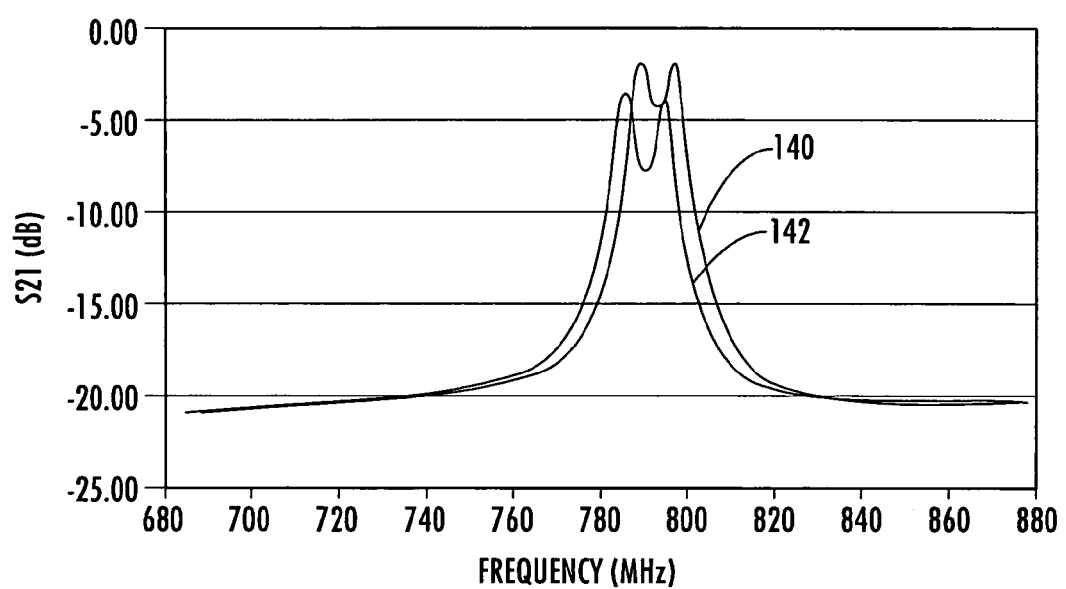
FIG. 12 is a graph showing the response versus frequency for the ladder filter shown in FIG. 7B comparing the case where the mechanically coupled resonators are identical to the case where the two resonators have different lengths.

The coupled resonator ladder filter is also much more robust to fabrication tolerances than the single resonator device of FIG. 7A. FIG. 11 at 130 shows the ladder filter response characteristic for the configuration of FIG. 7A if one of the resonators is 0.05 μm longer than the other resonator. The response of a ladder made with identical resonators is also shown at 120. In FIG. 12 the response of a coupled-resonator, (see FIG. 7B), for an identical variation in the resonator lengths is shown. The curve 140 assumes identical resonators 6 μm in length and curve 142 assumes one resonator 6 μm in length and one resonator 6.05 μm in length.

Figure 14:
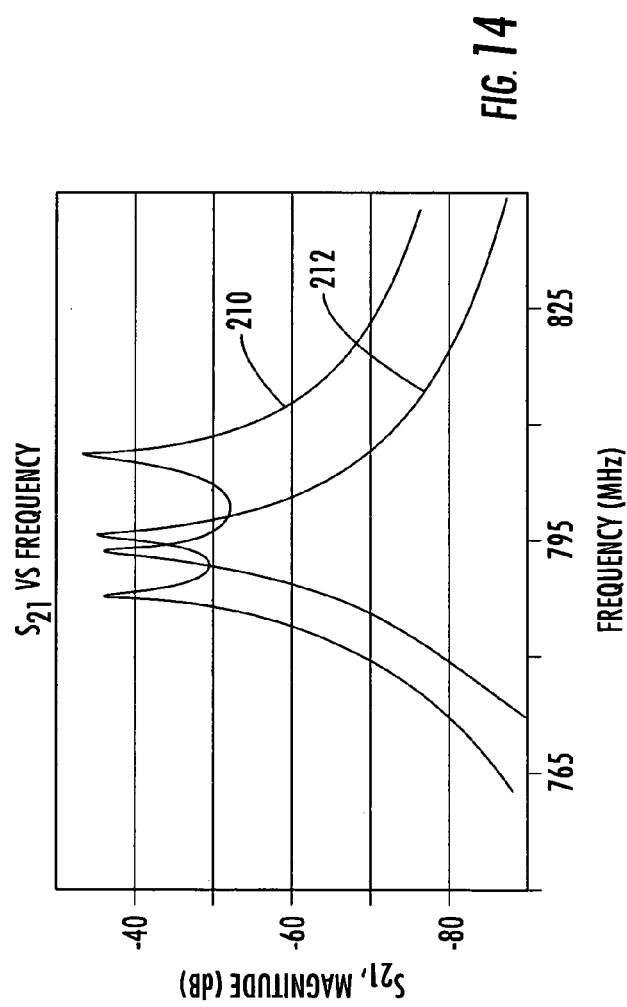
FIG. 14 is a graph of the response versus frequency for the resonator system shown in FIG. 13.
Figure 13:
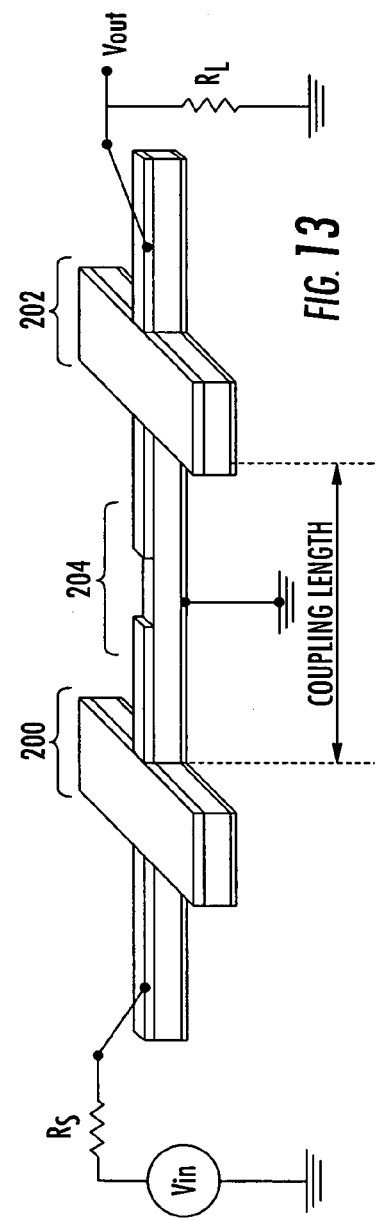
FIG. 13 is a schematic three-dimensional view showing another embodiment of a resonator system in accordance with the subject invention.

In FIG. 13, resonator 200 is edge coupled to resonator 202 via tether 204. Resonators 200 and 202 are identical in length (6 μm) and width (3 μm) and thickness (0.5 μm). When tether 204 is 7 μm in length, the response versus frequency profile is shown as curve 210 in FIG. 14. When tether 204, FIG. 13 is 14 μm, the response versus frequency curve is as shown at 212 in FIG. 14. The electrode configuration is shown in FIG. 13.

The result, in any configuration, is a new resonator system including two or more individual resonators mechanically coupled which provides a desirable bandpass characteristic. The system can be tuned by varying the geometry of the mechanical interconnection between the two or more individual resonators. The system can be used as a filter and allows for an optimization of the bandpass characteristic. There are many possible variations of electrode interconnections and, in one embodiment, the system can be manufactured as a multi-terminal device. Sub-micron gaps and large actuation voltages are avoided. The possibility of using a longitudinal mode in a plane of the wafer allows the frequencies to be lithographically controlled. Arrays of resonators with widely different center frequencies can be fabricated on a single chip. The effect of the Young's modulus softening with temperature can be compensated for by adding a thin oxide film (e.g., silicon dioxide) with a temperature response complimentary to the rest of the resonator materials.

The resonator system described herein can be made very small and include improved impedance matching features. If aluminum nitride is used as a piezoelectric material, integration with silicon CMOS, SiGe, and other RF ASIC technologies is possible. All of the resonators can have the same mode frequencies and additional modes can be closely spaced and used for bandpass filter designs.

Although specific features of the invention are shown in some drawings and not in others, however, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments. Other embodiments will occur to those skilled in the art and are within the following claims.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

What is claimed is:

1. A resonator system comprising:
a substrate;
a plurality of resonators each including piezoelectric material suspended relative to the substrate;
an edge of each resonator mechanically coupled to an edge of another resonator, the plurality of resonators expanding and contracting reaching resonance in response to an applied electric field; and
flexible supports for suspending the resonators relative to the substrate.

2. The system of claim 1 in which there is a tether between each pair of resonators.

3. The system of claim 2 in which the tether has a geometrical shape tailored to change the frequency response of the system.

4. The system of claim 2 in which the resonators and the tether(s) all lie in the same plane.

5. The system of claim 2 in which each resonator is rectangular in shape.

6. The system of claim 2 in which one rectangular resonator is oriented with a long edge parallel to and facing a long edge of another rectangular resonator and the tether extends between said long edges.

7. The system of claim 1 in which a fundamental frequency of all the resonators is the same or approximately the same.

8. The system of claim 1 in which the fundamental frequency of two resonators is different.

9. The system of claim 1 in which one said resonator includes an input electrode disposed on a first surface thereof and another said resonator includes an output electrode on a second surface thereof.

10. The system of claim 1 in which the piezoelectric material is aluminum nitride.

11. The system of claim 1 in which the substrate includes a cavity and the flexural supports suspend the resonators relative to the cavity in the substrate.

12. A resonator system comprising:
a substrate;
a plurality of resonators each including piezoelectric material suspended relative to the substrate; and
an edge of each resonator mechanically coupled by a tether to an edge of another resonator, the plurality of resonators expanding and contracting reaching resonance in response to an applied electric field, said tether having a geometrical shape tailored to change the frequency response of the system.

13. A resonator system comprising:
a substrate;
at least two piezoelectric members each coupled via a tether connecting spaced edges of the two members;
a flexible support connected to each outer member for suspending the members relative to the substrate; and
electrode material extending along at least one side of each support, opposite sides of both members, and at least one side of said tether.

14. A resonator system comprising:
a substrate;
a plurality of resonators each including piezoelectric material suspended relative to the substrate in which the fundamental frequency of two resonators is different; and
an edge of each resonator mechanically coupled to an edge of another resonator, the plurality of resonators expanding and contracting reaching resonance in response to an applied electric field.

* * * * *